United States Patent [19]

McDermott

[11] Patent Number: 5,053,771
[45] Date of Patent: Oct. 1, 1991

[54] ADAPTIVE DUAL RANGE ANALOG TO DIGITAL CONVERTER

[75] Inventor: Bruce C. McDermott, Penfield, N.Y.

[73] Assignee: Eastman Kodak Company, Rochester, N.Y.

[21] Appl. No.: 553,019

[22] Filed: Jul. 16, 1990

[51] Int. Cl.[5] .............................................. H03M 1/14
[52] U.S. Cl. .................................... 341/156; 341/139
[58] Field of Search ................. 341/138, 139, 140, 156

[56] References Cited

U.S. PATENT DOCUMENTS

| | | | |
|---|---|---|---|
| 3,772,683 | 11/1973 | Dorey | 341/139 |
| 4,069,479 | 1/1978 | Carpenter et al. | 341/156 |
| 4,129,864 | 12/1978 | Carpenter et al. | 341/156 |
| 4,456,904 | 6/1984 | van de Grift | 341/156 |
| 4,535,319 | 8/1985 | Penney | 341/156 |
| 4,540,974 | 9/1985 | Schanne et al. | |
| 4,559,523 | 12/1985 | Wakita | |
| 4,733,217 | 3/1988 | Dingwall | |
| 4,734,677 | 3/1988 | Cake et al. | |
| 4,827,191 | 5/1989 | Chapman | 341/139 |
| 4,875,045 | 10/1989 | Lynch et al. | 341/139 |
| 4,937,539 | 6/1990 | Maio et al. | 341/165 |
| 4,939,517 | 7/1990 | Baltus et al. | 341/156 |

Primary Examiner—A. D. Pellinen
Assistant Examiner—Marc S. Hoff
Attorney, Agent, or Firm—Edward Dugas

[57] ABSTRACT

An adaptive dual range analog to digital converter particularly adaptive for use with film scanners employs a set-up parameter input arrangement for receiving externally generated control signals for adjusting the digital quantization step size of the analog to digital converter to compensate for quantization errors. According to a further embodiment of the present invention, the adaptive dual range analog to digital converter further includes an input signal range selection device for selecting a segment of the input analog signal to be converted to digital form using fine resolution quantization.

19 Claims, 5 Drawing Sheets

ADAPTIVE DUAL RANGE ANALOG TO DIGITAL CONVERTER

BACKGROUND OF THE INVENTION

1. Field of the Invention

The present invention generally relates to an analog to digital converter for use with film scanners which digitalize scene information originating on negative and/or print film; and particularly, to an adaptive dual range analog to digital converter which provides adaptive distribution of the quantization resolution of the analog to digital converter so as to eliminate errors during digitalization resulting from the non-linear relationship between variations in film density and a corresponding exposure illuminant.

2. Discussion of the Background

Many forms of film scanners digitalize scene information originating on negative and print film during which film density is related to a corresponding exposure illuminant. Typically, the film is scanned, for example by a video camera, to produce an analog film information signal relating to variations in film density. Signal values of the signal are then related to corresponding exposure illuminants for the particular film density indicated by the signal values as seen in FIG. 3 and converted to digital form using a linear analog to digital converter (ADC) of the film scanner.

Figure 3:
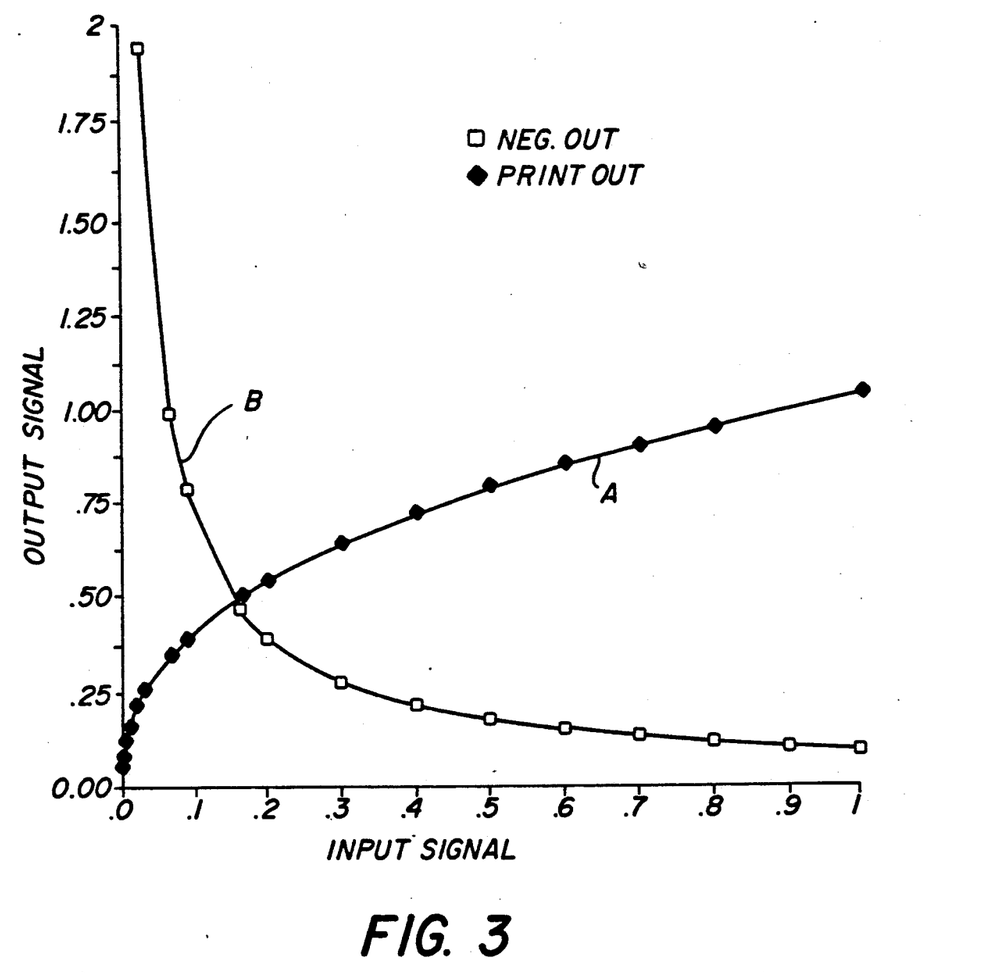
FIG. 3 illustrates the correct input versus output response curves for a typical film scanner.

Since film density is proportional to the log of the exposure illuminant, i.e., d log e, with negative film, the majority of the detailed scene information is exposed in the dense portion of the negative or in the "shoulder" of the d log e curve as can best be seen with reference to curve B of FIG. 3. Thus, light areas in the scene become dark on the negative and dark areas in the scene become light, i.e., transparent.

With print film, the majority of the detailed information is exposed in the light portions of the positive print film or in the "toe" of the d log e curve A of FIG. 3. Thus, light areas in the scene become light on the positive and dark areas in the scene become dark, i.e., more density. As expected, these curves A and B are non-linear.

However, one problem encountered by such digital film scanners involves the introduction of errors into the analog to digital conversion process by the linear ADC due to the non-linear relationship between variations in film density and the corresponding exposure illuminant. These errors result from the fact that a linear analog to digital converter assigns the same weight, i.e., analog voltage quanta, to each digital step in its dynamic range. Since system response is non-linear, an error is introduced that is equal to the difference between the non-linear system response and the quantization distribution of the analog to digital converter.

The generation of this error can be seen by simple analysis of the curves of FIG. 3. Assuming that the linear analog to digital converter used in the film scanner discussed above has a full range of 20 quantization steps, that is, one step per each minor horizontal division. Then for the print film curve A of FIG. 3, the 0.05 to 0.10 minor divisions of the input signal on the horizontal scale corresponds to approximately 0.8 vertical divisions of the output signal. However, the 0.75 to 0.8 minor divisions on the horizontal scale of the input signal of the print film curve A corresponds to approximately 0.2 vertical division of the output signal.

Applying the same analysis to the negative film curve B of FIG. 3, the 0.05 to 0.10 minor divisions of the input signal on the horizontal scale corresponds to 7.0 vertical divisions of the output signal. However, the 0.75 to 0.8 minor divisions of the input signal on the horizontal scale corresponds to 0.1 vertical divisions of the output signal.

ADCs which have both coarse and fine resolution capabilities have been disclosed. For example, a subranging analog to digital converter, such as disclosed by U.S. Pat. No. 4,733,217, utilizes a coarse ADC which generates the four more significant bits (MSBs) and two fine resolution analog to digital converters for generating the four lesser significant bits (LSBs). A combining circuit combines the MSBs with the LSBs from the appropriate fine ADC and arranges them into a sequence of digital samples representing the analog signal. However, this arrangement makes no provision for varying the quantization resolution of the ADCs in that the size of each quantization step of a given ADC is set.

U.S. Pat. No. 4,559,523 discloses another subranging ADC arrangement utilizing two separate AD stages to convert an input analog signal to a plural-bit digital signal to thereby gain higher resolution. However, this arrangement makes no provision for adaptively varying the quantization resolution of the two separate ADC stages.

U S. Pat. No. 4,540,974 discloses an adaptive analog to digital converter which uses internal digital peak detectors and the ADC output to control the analog input gain stage. The purpose is to adjust the input signal to be the full input peak to peak voltage of the ADC to thereby use the full range of the ADC. This technique uses internal feedback to adapt the ADC to the input signal regardless of the amplitude of the input signal. However, this arrangement makes no provision for varying the quantization resolution of the ADC based on variations of the input signal to prevent the introduction of errors resulting from the non-linear response and the quantization distribution of the analog to digital converter.

SUMMARY OF THE INVENTION

Therefore, it is an object of the present invention to provide a dual range analog to digital converter for a film scanner which provides adaptive distribution of the quantization resolution.

It is a further object of the present invention to provide an adaptive dual range analog to digital converter having an adjustable digital quantization step size which is controlled by externally generated control signals.

It is a further object of the present invention to provide an adaptive dual range analog to digital converter having an input signal range selection arrangement for selecting a segment of an input analog signal to be converted to digital form by an adjustable fine resolution quantization section of the analog to digital converter, the selection of the input signal segment being controlled by externally generated control signals.

Still another object of the present invention is to provide an adaptive dual range analog to digital converter which minimizes errors introduced into the digitalization of film scene information resulting from nonlinear system response and inappropriate quantization distribution of a linear analog to digital converter.

These and other objects, advantages and features of the present invention are achieved, according to preferred embodiments thereof, by an adaptive dual range analog to digital converter comprising an input circuit for receiving an input analog signal to be digitalized, an output of the input circuit being provided to a coarse resolution quantization analog to digital converter, having a set digital quantization size, for providing a digital word output and to a fine resolution quantization analog to digital converter, having an adjustable digital quantization step size, which also provides a digital word output. An output circuit outputs a digital word based on the digital word outputs received from at least one of the fine and coarse resolution analog to digital converters, the digital word being representative of the input analog signal received at the input circuit. Further, a set-up parameter input arrangement receives externally generated control signals for controlling the adjustment of the digital quantization step size of the fine analog to digital converter and for controlling the digital word outputted by the output circuit so as to minimize the introduction of errors resulting from linear analog to digital conversion.

According to a further embodiment of the present invention, the fine resolution quantization analog to digital converter is provided with an input signal range selection arrangement for selecting a segment of the input analog signal to be converted to digital form by the fine resolution analog to digital converter. In this embodiment the input parameter arrangement receives externally generated control signals which control the selection and size of the segment to be digitalized by the fine resolution analog to digital converter.

One particular feature of the present invention is the ability to employ externally generated control signals to control the operation of the adaptive analog to digital converter. Since the typical film scanner frequently has a film "pre-scan" operation wherein the film is scanned twice and the first scan is used to derive and store scanner set-up parameters for each scene exposure sequence in the film, these set-up parameters can be stored in a computer memory. During the second scan, the stored parameters can be used as the externally generated control signals to dynamically adjust the adaptive dual range analog to digital converter of the present invention so as to optimize the digitalization for each scene sequence based on the "pre-scan" set-up parameters.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Various other objects, features and attendant advantages of the present invention will be more fully appreciated as the same becomes better understood from the following detailed description when considered in connection with the accompanying drawings in which like reference characters designate like or corresponding parts throughout the several views.

Figure 1:
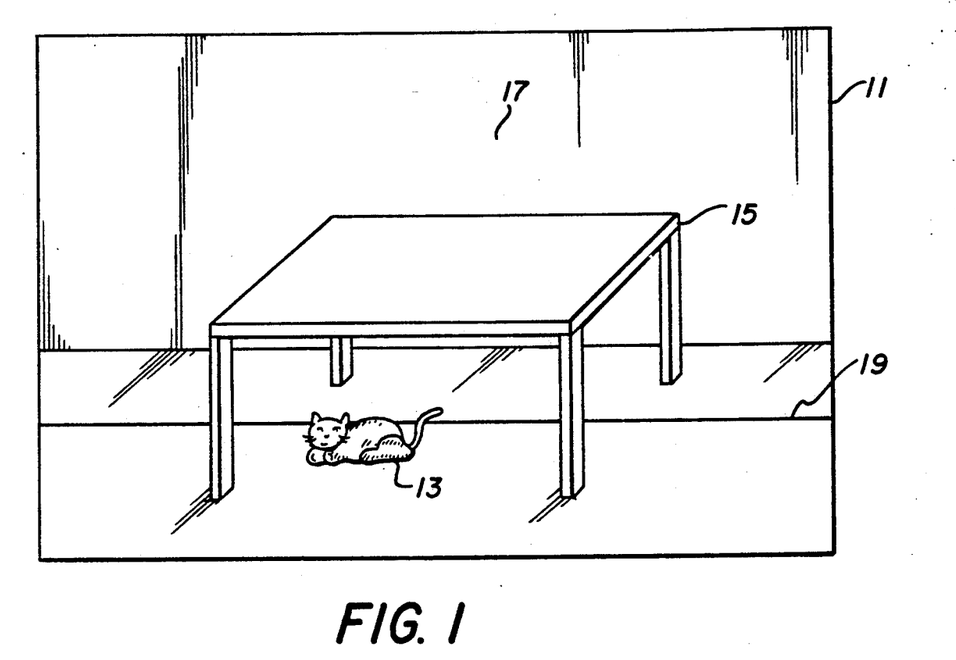
FIG. 1 illustrates a variation in scene information of a photograph.
Figure 2:
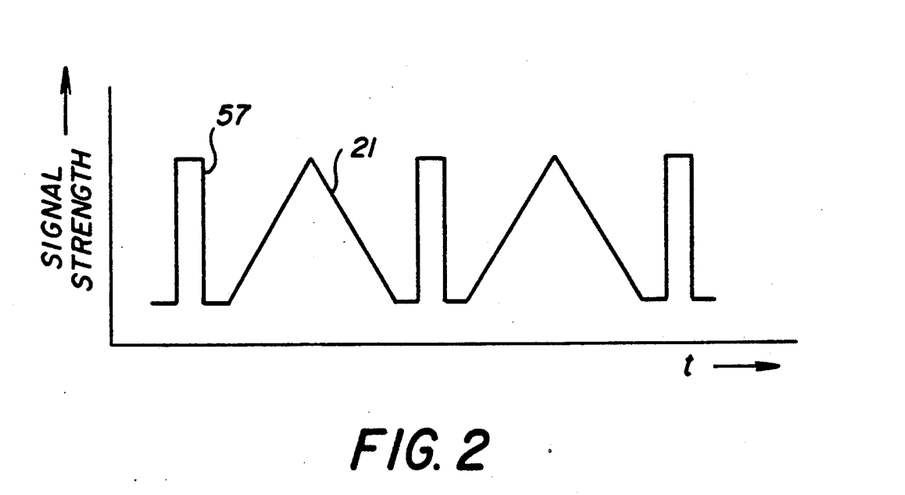
FIG. 2 illustrates a television camera signal generated during scanning of the photograph of FIG. 1.

Referring to FIG. 1, a photograph 11 is illustrated which depicts a scene including a cat 13, a table 15 and background 17. During digitalization, the photograph 11 is scanned by a film scanner, for example using a video camera, one raster scan 19 of photograph 11 generating an analog film information signal 21 as shown in FIG. 2.

The signal values of the analog film information signal 21 vary in accordance with the film density, i.e., the darkness or lightness of the scene information, and these signal values are related to corresponding exposure illuminants in accordance with the graphic representation illustrated by FIG. 3 as discussed above.

Figure 4:
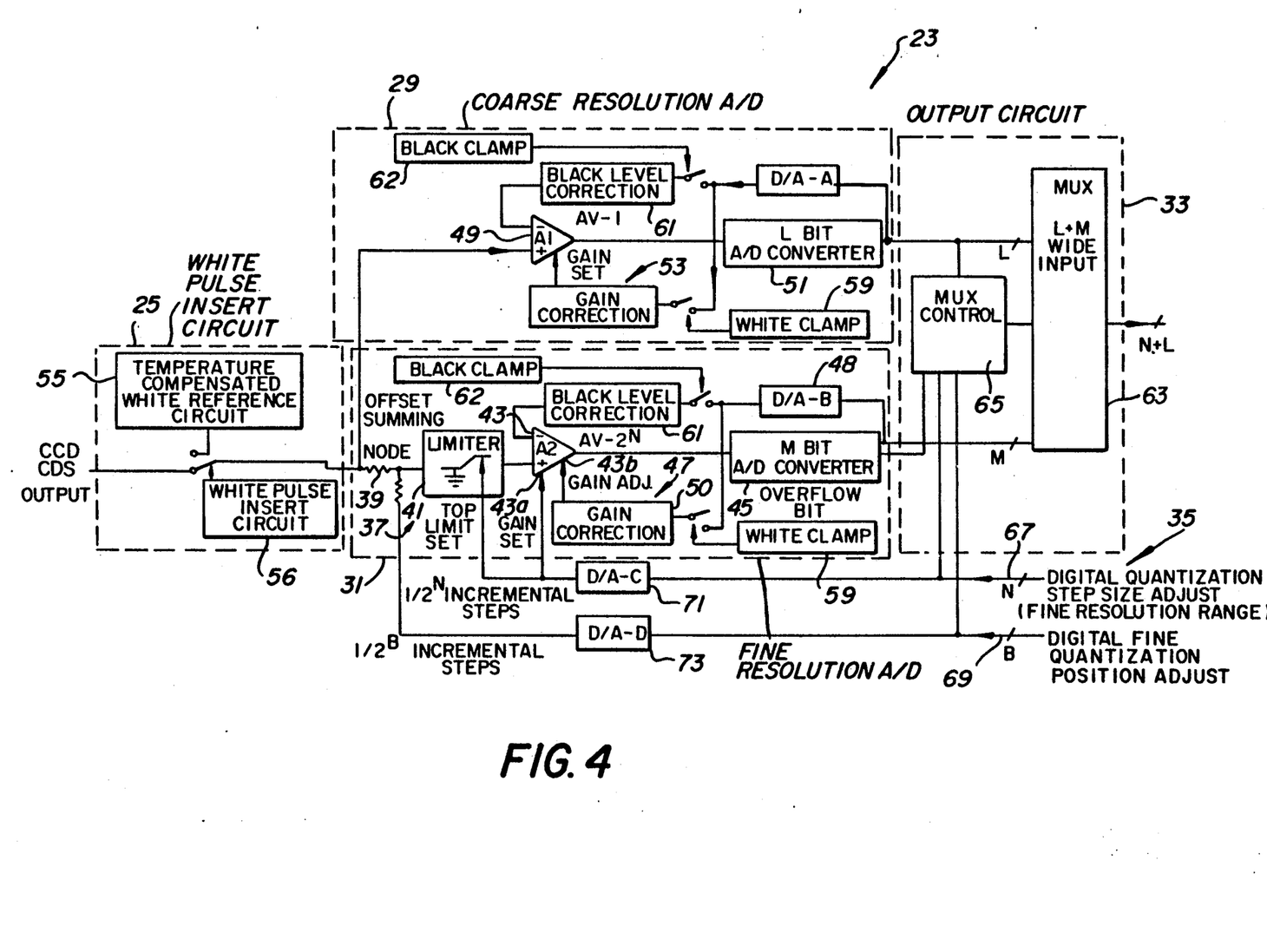
FIG. 4 illustrates one embodiment of the adaptive dual range analog to digital converter according to the present invention.

Referring to FIG. 4, one embodiment of the adaptive dual range analog to digital converter of the present invention is illustrated generally at 23. The analog to digital converter 23 includes an input circuit 25 for receiving an input analog signal 21, for example, a charge coupled device video output correlated, double sampled (CCD, CDS) video output signal. According to one embodiment of the present invention, the input circuit 25 includes a temperature compensated white reference circuit 55 and a white pulse insert circuit 56 which are used to insert a white reference level 57 into the incoming CCD CDS analog signal 21 during the blanking time. This white reference level 57 is used to match the full input range of the A/D converter 23 to the full input range of the input signal 21 as will be more fully described hereinafter.

Connected to the input circuit 25 so as to receive the input analog signal 21 to be digitalized are a coarse resolution quantization analog to digital converter 29 having a set digital quantization step size for providing a digital word output and a fine resolution quantization analog to digital converter 31 having an adjustable digital quantization step size for providing a digital word output.

Connected to the outputs of both the coarse and fine resolution quantization analog to digital converters 29, 31 is an output circuit 33 for outputting a digital word based on the digital word output received from at least one of the coarse and fine resolution analog to digital converters 29, 31. The digital word outputted by the output circuit 33 is representative of the input analog signal 21 received by the input circuit 25.

Also provided is a set-up parameter input arrangement, generally indicated at 35, for receiving externally generated control signals for controlling the adjustment of the digital quantization step size of the fine analog to digital converter 31 and for controlling the digital word outputted by the output circuit 33.

Since the adaptive dual range analog to digital converter 23, illustrated by FIG. 4, is preferably employed with a film scanner having a "pre-scan" operation, the set-up parameter input arrangement 35 receives control signals generated during the first scan of the photograph 11, these parameters being used to dynamically adjust the adaptive dual range analog to digital converter 23 so as to optimize its operation for each scene sequence as will be discussed more fully below.

According to one embodiment of the present invention, an input signal range selection arrangement, generally indicated at 37, is included for selecting a segment of the input analog signal 21 to be converted to digital form by the fine resolution quantization analog to digital converter 31.

The input signal range selection arrangement 37 includes an offset summing node 39 for offsetting the input analog signal 21 received from the input circuit 25 by a given voltage as controlled by the set-up parameters generated during the "pre-scan" operation of the film scanner. The input signal selection arrangement 37 also includes an adjustable input limiter 41, connected between the offset summing node 39 and further stages of the fine resolution ADC 31, for selecting the size of the segment of the analog signal 21 to be converted to digital from by the fine resolution ADC 31. The operation of the input limiter 41 is also controlled in accordance with the set-up parameter generated during the "pre-scan" operation. In both cases, the externally generated control signals are inputted respectively to the offset summing node 39 and the input limiter 41 via the set-up parameter input arrangement 35.

The fine resolution ADC 31 includes a programmable gain input amplifier 43 having gain set and gain adjust inputs 43a, 43b, respectively. Also included is an M bit analog to digital converter 45, connected to an output of the programmable input amplifier 43, for outputting a digital word of M bits to the output circuit 33.

The gain set input 43a of the programmable gain amplifier 43 is employed to adjust the digital quantization step size of the fine ADC 31 in accordance with the externally generated control signals formulated during the "pre-scan" operation and received by the set-up parameter input arrangement 35. The gain adjust input 43b is used to make slight changes in the gain of the programmable gain input amplifier 43, with a white clamp circuit 59, using the white reference level 57 inserted by the input circuit 25, to match the full input range of the fine ADC 31 to the full output range of the limiter 41.

The white clamp circuit 59 comprises a part of a gain adjustment feedback arrangement, generally indicated at 47, which includes a digital to analog converter (DAC) 48 having an input connected to receive an output of the M bit ADC 45 and an output switchably connected to a black level correction circuit 61, which is connected to an input of the programmable gain input amplifier 43. The output of the DAC 48 is also connected, via the white clamp circuit 59, to a gain correction circuit 50 which is connected to the gain adjust input 43b of the input amplifier 43 for making fine adjustments to the gain of amplifier 43 as discussed above.

The black level correction circuit 61, switchably connected to a black level clamp circuit 62, is provide for amplifier input offset voltage compensation and temperature compensation of the input limiter 41 in that the limiter limit thresholds vary with temperature. This circuitry adjusts the inputs to the ADCs 45 and 51 such that the full input range of the converters 45, 51 are utilized in data conversion.

The coarse resolution analog to digital converter 29 comprises an input amplifier 49 for receiving the input analog signal 21 outputted by the input circuit 25, the input amplifier 49 being connected ahead of the offset summing node 39. Also included is an L bit analog to digital converter 51 connected to the output circuit 33 for outputting a digital word of L bits representative of the input analog signal 21 received by the input amplifier 49. The gain adjustment means arrangement, generally indicated at 53, is provided for adjusting the gain of the input amplifier 49 to match the full range of the coarse resolution analog to digital converter 29 to the full range of the input analog signal 21. In this regard, the gain adjust arrangements 47 and 53 of the coarse and fine analog to digital converter 29, and 31 respectively are similar in structure and therefore arrangement 53 need not be discussed further with respect to the coarse ADC 29.

As noted above, the outputs of the coarse and fine resolution analog to digital converters 29, 31 are provided to the output circuit 33. This output circuit 33 includes an output multiplexer (MUX) 63 for logically combining the digital word outputs of the respective coarse and fine analog to digital converters 29, 31 to form a complete output word. An output multiplexer (MUX) control 65 is used to determine which of the L bit and M bit converter outputs are to be used for actual circuit data output based on the input signal 21 and the externally generated control signals received by the set-up parameter input arrangement 35.

Based on these externally generated control signals, the MUX control 65 uses a stored look-up table or graph, of set-up parameter input values, which indicates when the outputs of the coarse and fine ADCs 29, 31 are to be combined or alternatively, when only one of the digital word outputs of the coarse or fine ADCs 29, 31 is sufficient for use as the output word. The graph or table is constructed such that set-up parameter input values control selection of the outputs of one of or both of the coarse and fine ADCs 29, 31 to the MUX 63.

The set-up parameter input arrangement 35 includes a digital quantization step size adjust input 67 as well as a digital fine quantization position adjust input 69, each input 67, 69 being provided to receive a digital control word of respectively N and B bits. Further, each input 67, 69 is provided respectively with a digital to analog converter (DAC) 71, 73 for converting the digital control word to an analog value.

A lower transition point of the analog signal 21, where the fine quantization analog to digital converter 31 becomes active, is controlled by an offset voltage applied to the input offset node 39 and by the lower limit of the input limiter 41. The offset voltage is set by the fine digital quantization position adjust input value provided, via input 69, to the digital to analog converter 73 which has its output connected between the offset summing node 39 and the input limiter 41. An upper transition point of the analog signal, where the fine quantization analog to digital converter 31 is no longer effective, is established by a combination of the digital quantization step size adjust value inputted to input 67 and the digital fine quantization adjust value provided to input 69 as well as the output of the coarse ADC 29.

Further, the gain increments of the programmable gain input amplifier 43 and the input limiter incremental steps of the input limiter 41 are specified to be one (1) divided by an integral power of 2(N) in the embodiment illustrated in FIG. 4. Additionally, the input offset node steps are specified to be 1 divided by an integral power of 2 (B). The "power of 2" constraints applied to this embodiment are to minimize the complexity of the output control MUX 65 and the output MUX circuitry 63. This also insures correct circuit behavior at the crossover points between the coarse quantization and fine quantization analog to digital converters 29, 31.

Figure 5A:
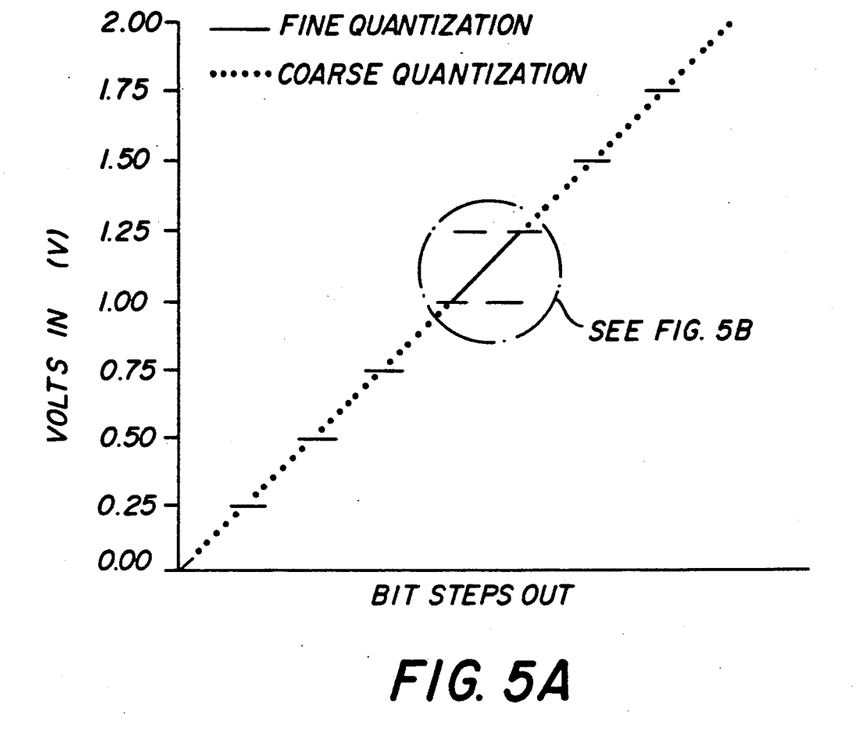
FIGS. 5A-5B illustrate the variation in the quantization resolution of the analog to digital converter illustrated by FIG. 4.
Figure 5B:
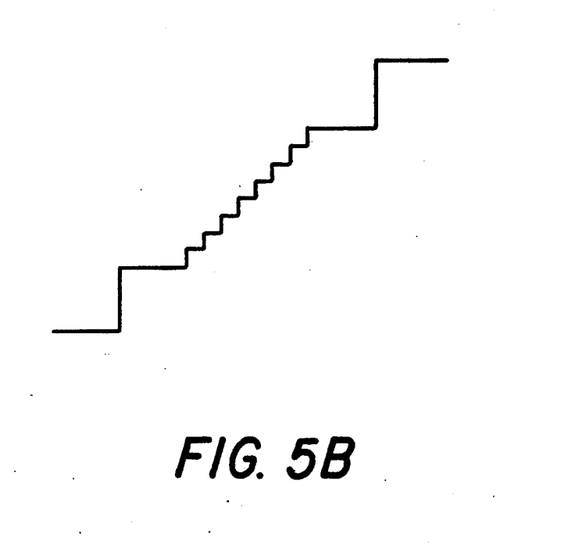

The operation of the ADC 23 is explained below. Assuming that B and N both equal 3, the arrangement of FIG. 4 allows the fine quantization analog to digital converter 31 to convert any ⅛ segment of the full scale input signal 21 with three additional bits of resolution as best seen in FIGS. 5A–5B. Which segment converted by the fine quantization analog to digital converter 31 is controlled by the offset voltage of the offset summing node 39. In the embodiment of FIG. 4, the offset voltages would be 0V, 0.25V, 0.5V, 0.75V, 1.00V, 1.25V, 1.50V, and 1.75V for each of the eight segments as shown in the performance plot of FIGS. 5A, 5B assuming a full input range of 0 to +2 volts.

The MUX control 65 uses digital control words from inputs 67, 69 to control the output MUX 63 to provide a digital word output of N+L when fine resolution is required. As N is increased or decreased, the output MUX control 65 and output MUX circuitry 63 account for the change in output word utilizing the internally stored look-up table, graph or curve of N, B values. Since the segment of the input signal 21 to be converted with fine quantization can be changed on the fly, by simply changing the value input to the fine quantization position adjust DAC 73, the circuitry of FIG. 4 provides an adaptive dual range analog to digital converter which provides performance characteristics specifically adapted to input signal characteristics. Further, the size of the segment of the input signal that is converted with fine quantization and the number of fine quantization bits can be changed by inputting new values to the digital quantization step size DAC 71.

Figure 6A:
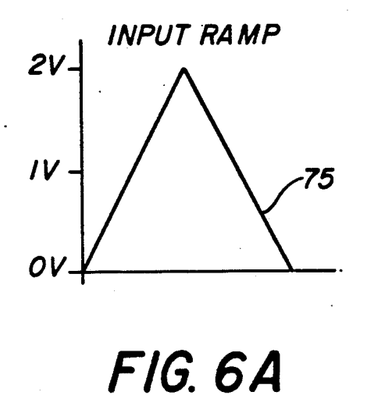
FIGS. 6A-6D illustrate the operation of the input signal range selection arrangement for selecting a segment of the input analog signal to be converted to digital form in accordance with a further embodiment of the present invention.
Figure 6B:
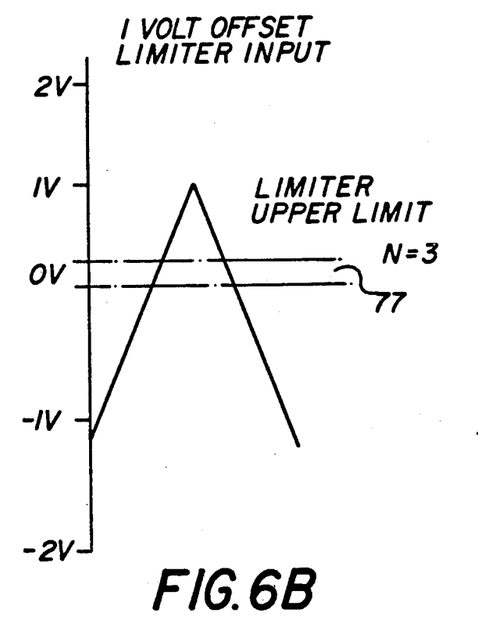
Figure 6C:
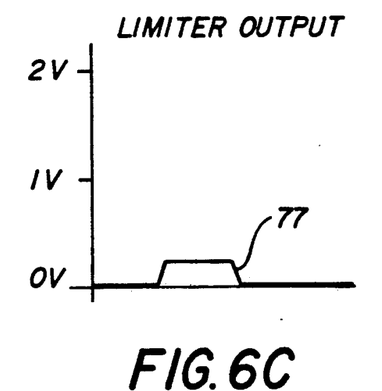
Figure 6D:
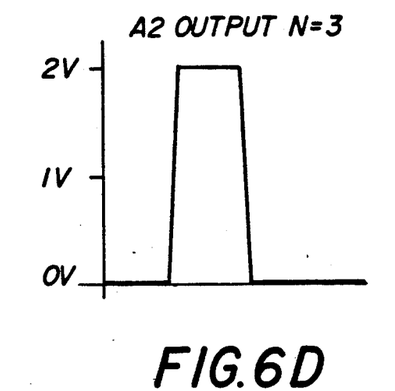

Referring to FIGS. 6A–6D, the operation of the input signal range selection arrangement 35 is illustrated. In this regard, FIG. 6A illustrates an input video signal 75 which goes from black to white and back to black. By employing a one (1) volt offset limiter input via input 69 to offset summing node 39, the input signal 75 is offset in a negative direction, the output of the offset summing node being provided to the limiter 41 which selects a slice 77 of the input signal 75. This slice 77 is outputted by the limiter 41 to the programmable gain input amplifier 43 having its gain adjusted, via input 73, to provide the requisite quantization step size for providing the fine quantization illustrated in FIGS. 5A and 5B.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. An adaptive dual range analog to digital converter comprising:
    an input circuit for receiving an input analog signal to be digitalized;
    a coarse resolution quantization analog to digital converter connected to said input circuit for receiving the input analog signal therefrom, and having a set digital quantization step size, for providing a digital word output;
    a fine resolution quantization analog to digital converter connected to said input circuit for receiving the input analog signal therefrom, and having an adjustable digital quantization step size, for providing a digital word output and including an input signal range selection means for selecting a segment of the input analog signal to be converted to digital form by the fine resolution quantization analog to digital converter;
    an output circuit for outputting a digital word based on the digital word outputs received from at least one of the fine and coarse resolution quantization analog to digital converters, the digital word being representative of the input analog signal received at the input circuit; and
    set-up parameter input means for receiving externally generated control signals for controlling the adjustment of the digital quantization step size of the fine analog to digital converter, for controlling the selection of the segment of the input analog signal to be converted by the fine resolution analog to digital converter, and for controlling the digital word outputted by the output circuit.

2. An adaptive dual range analog to digital converter according to claim 1, wherein the coarse resolution quantization analog to digital converter includes:
    an input amplifier for receiving the input analog signal;
    an L bit A/D converter for outputting a digital word of L bits representative of the input analog signal received by the input amplifier; and
    first gain adjust means for adjusting the gain of the input amplifier to match the full input range of the coarse resolution analog to digital converter to the full input range of the input analog signal.

3. An adaptive dual range analog to digital converter according to claim 1, wherein the fine resolution quantization analog to digital converter includes:
    a programmable gain input amplifier for receiving the segment of the input analog signal selected by the input signal selecting means,
    an M bit A/D converter for outputting a bits representative of the segment of the input analog signal received by the programmable gain input amplifier;
    gain adjusting means for adjusting the gain of the programmable gain input amplifier to match the full input range of the fine resolution analog to digital converter to the full input range of the segment of the input analog signal received by the programmable gain input amplifier;
    means for defining the segment of the input analog signal selected by the input signal range selection means based on the externally generated control signals; and
    means for setting the programmable gain of the programmable gain amplifier to set the digital quantization step size of the fine resolution analog to digital converter based on the externally generated control signals.

4. An adaptive dual range analog to digital converter according to claim 1, wherein the output circuit comprises:
    an output multiplexer for logically combining the digital word outputs of the coarse and fine resolution analog to digital converters to form a complete output word; and
    an output multiplexer control for controllably applying at least one of the coarse and fine analog to digital converter digital word outputs to the output multiplexer based on the externally generated control signals received by the set-up parameter input means.

5. An adaptive dual range analog to digital converter according to claim 1, wherein the input signal range selection means comprises:
   an offset summing node for offsetting the input analog signal received from the input circuit by incremental offset node steps to set a lower transition point of the segment of the input analog signal at which the fine resolution quantization analog to digital converter becomes active; and
   an adjustable input limiter connected between the offset summing node and the programmable gain input amplifier, the adjustable input limiter setting a size of the segment of the input analog signal to be converted to digital form by the fine resolution quantization analog to digital converter.

6. An adaptive dual range analog to digital converter according to claim 5, wherein the offset node steps of the offset summing node are controlled by an offset voltage set by the externally generated control signals received by the set-up parameter input means, the offset node steps being specified as 1 divided by two to the Bth power where B is an whole number.

7. An adaptive dual range analog to digital converter according to claim 6, wherein the gain of the programmable gain input amplifier is changed by increment steps, the incremental steps being specified by 2 to the Nth power where N is a whole number.

8. An adaptive dual range analog to digital converter according to claim 7, wherein the adjustable input limiter is adjusted by incremental steps which are specified to be the same integral power of 2 as the incremental steps of the amplifier gain of the programmable gain amplifier.

9. An adaptive dual range analog to digital converter according to claim 8, wherein the digital word outputted by the output circuit has a maximum of N plus L bits, L being the number of bits contained in the digital word output of the coarse resolution quantization analog to digital converter and wherein the digital word outputted by the fine resolution quantization analog to digital converter has at least N bits.

10. An adaptive dual range analog to digital converter according to claim 1, wherein the input analog signal has at least a portion with parameters which require fine resolution analog to digital conversion and the externally generated control signals control the selection of the segment of the input analog signal to be converted by the fine resolution analog to digital converted based on input analog signal parameters which indicate fine resolution analog to digital conversion.

11. An adaptive dual range analog to digital converter comprising:
   an input circuit for receiving an input analog signal to be digitalized;
   a coarse resolution quantization analog to digital converter connected to said input circuit for receiving the input analog signal therefrom, and having a set quantization step size for providing a digital word output;
   a fine resolution quantization analog to digital converter connected to said input circuit for receiving the input analog signal therefrom, and having an adjustable digital quantization step size, for providing a digital word output;
   an output circuit for outputting a digital word based on the digital word outputs received from at least one of the fine and coarse resolution quantization analog to digital converters, the digital word being representative of the input analog signal received at the input circuit; and
   set-up parameter input means for receiving externally generated control signals for controlling the adjustment of the digital quantization step size of the fine analog to digital converters and for controlling the digital word outputted by the output circuit.

12. An adaptive dual range analog to digital converter according to claim 11, wherein the coarse resolution quantization analog to digital converter includes:
   an input amplifier for receiving the input analog signal;
   an L bit A/D converter for outputting a digital word of L bits representative of the input analog signal received by the input amplifier; and
   first gain adjust means for adjusting the gain of the input amplifier to match the full input range of the coarse resolution analog to digital converter to the full input range of the input analog signal.

13. An adaptive dual range analog to digital converter according to claim 12, wherein the fine resolution quantization analog to digital converter includes:
   a programmable gain input amplifier for receiving the segment of the input analog signal selected by the input signal selecting means,
   an M bit A/D converter for outputting a digital word of M bits representative of the segment of the input analog signal received by the programmable gain input amplifier;
   second gain adjusting means for adjusting the gain of the programmable gain input amplifier to match the full input range of the fine resolution analog to digital converter to the full input range of the segment of the input analog signal received by the programmable gain input amplifier;
   means for defining the segment of the input analog signal selected by the input signal range selection means based on the externally generated control signals; and
   means for setting the programmable gain of the programmable gain amplifier to set the digital quantization step size of the fine resolution analog to digital converter based on the externally generated control signals.

14. An adaptive dual range analog to digital converter according to claim 13, wherein the output circuit comprises:
   an output multiplexer for logically combining the digital word outputs of the coarse and fine resolution analog to digital converters to form a complete output word; and
   an output multiplexer control for controllably applying at least one of the coarse and fine analog to digital converter digital word outputs to the output multiplexer based on the externally generated control signals received by the set-up parameter input means.

15. An adaptive dual range analog to digital converter according to claim 14, wherein the fine resolution quantization analog to digital converter further includes an input signal range selection means for selecting a segment of the input analog signal to be converted in digital form by the fine resolution quantization analog to digital converter, the input signal range selection means comprising:

an offset summing node for offsetting the input analog signal received from the input circuit by offset node steps to set a lower transition point of the segment of the input analog signal at which the fine resolution quantization analog to digital converter becomes active; and an adjustable input limiter connected between summing node and the programmable gain input amplifier, the adjustable input limiter setting a size of the segment of the input analog signal to be converted to digital form by the fine resolution quantization analog to digital converter; and the set-up parameter input means receives externally generated control signals for controlling the selection of the segment to be input analog signal to be converted by the fine resolution quantization analog to digital converter.

16. An adaptive dual range analog to digital converter according to claim 15, wherein offset node steps of the offset summing node are controlled by an offset voltage set by the externally generated control signals received by the set-up parameter input means, the offset node steps being specified as 1 divided by two to the Bth power where B is an whole number.

17. An adaptive dual range analog to digital converter according to claim 16, wherein the gain of the programmable gain input amplifier is changed by increment steps, the incremental steps being specified by 2 to the Nth power where N is a whole number.

18. An adaptive dual range analog to digital converter according to claim 17, wherein the adjustable input limiter is adjusted by incremental steps which are specified to be the same integral power of 2 as the incremental steps of the amplifier gain of the programmable gain amplifier.

19. An adaptive dual range analog to digital converter according to claim 18, wherein the digital word outputted by the output circuit has a maximum of N plus L bits wherein M is at least as large as N.

* * * * *

UNITED STATES PATENT AND TRADEMARK OFFICE
CERTIFICATE OF CORRECTION

PATENT NO. : 5,053,771

DATED : 10/1/91

INVENTOR(S) : Bruce C. McDermott

It is certified that error appears in the above-indentified patent and that said Letters Patent is hereby corrected as shown below:

Column 11, line 7, after "between" insert --the offset--.

Signed and Sealed this

Eleventh Day of January, 1994

Attest:

BRUCE LEHMAN

Attesting Officer     Commissioner of Patents and Trademarks